United States Patent [19]

Ogawa et al.

[11] Patent Number: 4,759,107
[45] Date of Patent: Jul. 26, 1988

[54] MONOLITHIC PIEZOELECTRIC ELEMENT AND METHOD OF ADJUSTING THE RESONANT FREQUENCY THEREOF

[75] Inventors: Toshio Ogawa; Akira Ando, both of Nagaokakyo, Japan

[73] Assignee: Murata Manufacturing Co., Ltd., Japan

[21] Appl. No.: 914,585

[22] Filed: Oct. 3, 1986

Related U.S. Application Data

[62] Division of Ser. No. 800,530, Nov. 21, 1985, abandoned.

[30] Foreign Application Priority Data

Dec. 10, 1984 [JP] Japan .................................. 59-261507

[51] Int. Cl.⁴ .............................................. H01L 41/08
[52] U.S. Cl. ................................... 29/25.35; 310/328; 310/365
[58] Field of Search .............. 29/25.35; 310/357–359, 310/365, 366, 328

[56] References Cited

U.S. PATENT DOCUMENTS

| | | | |
|---|---|---|---|
| 3,390,287 | 6/1968 | Sonderegger | 310/328 |
| 3,458,915 | 8/1969 | Miller et al. | 310/358 X |
| 3,489,931 | 1/1970 | Teaford | 310/359 X |
| 4,471,256 | 9/1984 | Igashira et al. | 310/359 X |
| 4,564,782 | 1/1986 | Ogawa | 310/358 X |

Primary Examiner—Carl E. Hall
Attorney, Agent, or Firm—Ostrolenk, Faber, Gerb & Soffen

[57] ABSTRACT

A monolithic piezoelectric element comprising a sintered body comprising a plurality of ceramic layers which is provided with a first electrode group which includes a plurality of electrodes electrically connected with each other and located between alternate pairs of adjacent layers, and a second electrode group which includes a plurality of electrodes interposed between the electrodes of the first electrode group and electrically connected with each other. The two groups of electrodes are electrically isolated from each other. The respective electrodes of the first and second electrode groups are electrically connected with each other through through-holes formed in the sintered body.

4 Claims, 5 Drawing Sheets

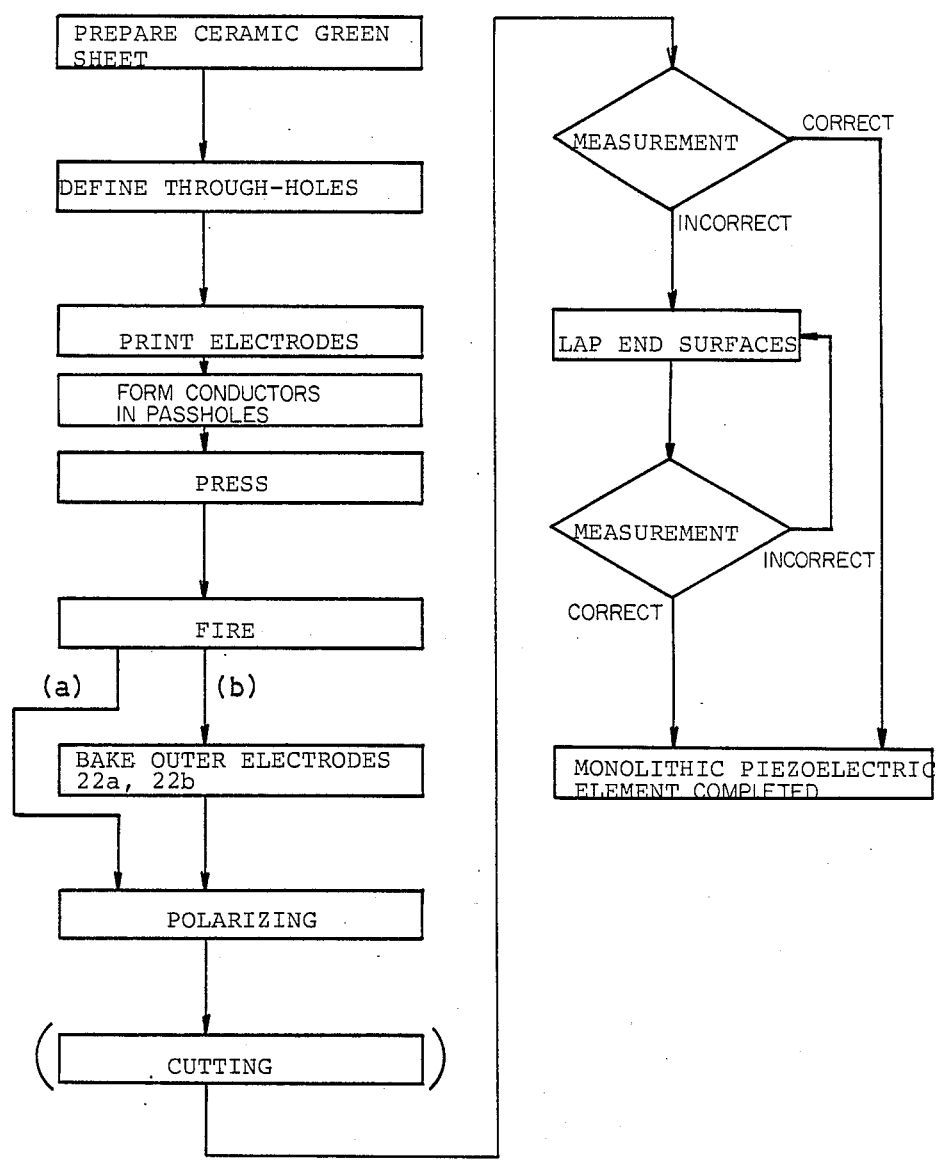

FIG.4
FIG.5
FIG.6
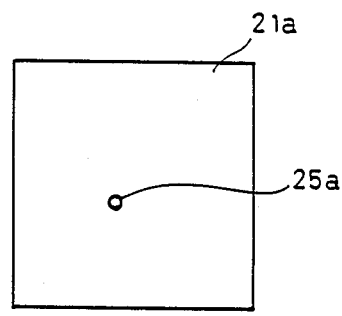
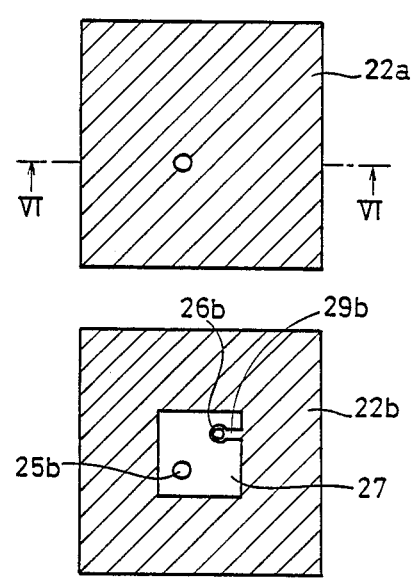
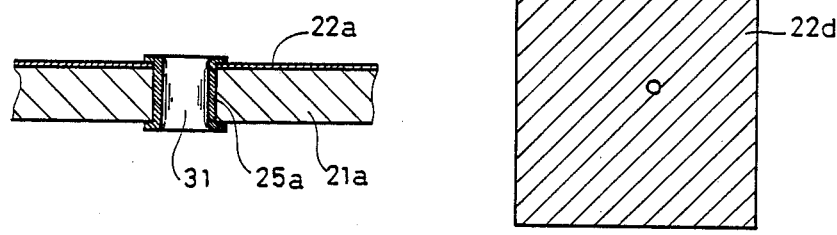

MONOLITHIC PIEZOELECTRIC ELEMENT AND METHOD OF ADJUSTING THE RESONANT FREQUENCY THEREOF

CROSS-REFERENCE TO RELATED APPLICATION

This is a division of U.S. patent application Ser. No. 800,530, filed Nov. 21, 1985, now abandoned.

BACKGROUND OF THE INVENTION

1. Field of the Invention

The present invention relates to an improvement in the structure of a monolithic multi-layer piezoelectric element, which comprises a sintered body obtained by laminating a plurality of ceramic green sheets provided with electrode patterns on the major surfaces thereof, and then cofiring the components of the laminated assembly thus obtained.

2. Description of the Prior Art

FIGS. 10 and 11 are perspective and sectional views showing a conventional plate type piezoelectric element 1 which is generally employed as a piezoelectric element utilizing counter extensional vibration. A polarized piezoelectric ceramic member 2 is provided on its upper and lower surfaces with electrodes 3 and 4, respectively. Thus, the desired counter extensional vibration can be obtained by applying a voltage to the electrodes 3 and 4. In such a plate type piezoelectric element 1, the resonance frequency can generally be controlled by lapping its end surfaces, or more generally its outer peripheral surfaces.

However, a piezoelectric element 1 of the type shown in FIGS. 10 and 11 is unsatisfactory when employed as, e.g., a second resonator for a ladder-type filter, which must have a low impedance.

A proposed solution to this problem is the monolithic piezoelectric element 11 shown in a schematic sectional view in FIG. 12. A plurality of stacked ceramic layers 11a to 11c are formed with inner electrodes 13b and 13c therebetween and then cofired. Outer electrodes 13a and 13d may be formed simultaneously with the inner electrodes 13b and 13c or applied separately after the initial firing. The electrodes 13a to 13d are electrically connected with each other and with end electrodes 15 and 16 in an alternating manner. The stacked ceramic layers 11a to 11c are polarized in the alternating directions indicated by the arrows in FIG. 12 by applying a voltage to the end electrodes 15 and 16. Then, by applying voltages to the end electrodes 15 and 16, the stacked layers 11a to 11c can be respectively expanded and contracted.

In the aforementioned monolithic piezoelectric element 11, the impedance can be made extremely low in comparison with the conventional plate type piezoelectric element, 1 while still maintaining a substantial size. However, the known method of lapping the end surfaces of the sintered body cannot be applied in this case to controlling a desired resonance frequency. In the monolithic piezoelectric element 11 as shown in FIG. 12, the end electrodes 15 and 16 formed on the end surfaces of the sintered body would be removed by lapping the end surfaces, preventing the use of the element 11 as a resonator.

SUMMARY OF THE INVENTION

Accordingly, an object of the present invention is to provide a monolithic piezoelectric element which can be readily and reliably adjusted to regulate the resonance frequency thereof.

A monolithic piezoelectric element according to an embodiment of the present invention comprises a sintered body obtained by stacking a plurality of ceramic green sheets provided with electrode patterns on major surfaces thereof and cofiring the same. A plurality of electrodes formed by the electrode patterns are arranged in stacked relationship between the layers of the sintered body. The plurality of electrodes comprise a first electrode group, including a plurality of alternately arranged electrodes which are electrically connected with each other, and a second electrode group including electrodes interposed between those of the first electrode group and also electrically connected with each other. The monolithic piezoelectric element according to a further aspect of the present invention further comprises first and second connecting portions for electrically connecting the respective electrodes forming the first and second electrode groups. The first and second connecting portions are defined by first and second conductive portions formed in through-holes provided within the sintered body.

The respective electrodes of the first electrode group are disposed and configured such that they cannot be electrically connected with the second conductive portion, while the respective electrodes of the second electrode group are disposed and configured such that they cannot be electrically connected with the first conductive portion.

As hereinabove described, a pair of through-holes electrically connect separate groups of alternately arranged electrodes in the monolithic piezoelectric element according to a feature of the present invention. Thus, the plurality of electrodes in the sintered body are electrically connected through the through-holes. Therefore, no outer electrodes are needed to be provided on the end surfaces of the sintered body to connect the electrodes in the sintered body, enabling the end surfaces to be lapped to readily and reliably control the resonance frequency. Further, the electrodes of the first and second electrode groups are connected through the aforementioned through-holes, permitting a plurality of monolithic piezoelectric elements to be simultaneously formed and then severed into separate elements, leading to efficient mass production at a low cost.

These and other objects, features, aspects and advantages of the present invention will become more apparent from the following detailed description a preferred embodiment of of the present invention when taken in conjunction with the accompanying drawings.

BRIEF DESCRIPTION OF THE DRAWINGS

FIG. 3 is a flow diagram illustrating the steps of a method for manufacturing a monolithic piezoelectric element according to the embodiment shown in FIGS. 1 and 2;

FIG. 4 is a plan view showing ceramic green sheets to be employed in manufacturing the embodiment shown in FIGS. 1 and 2;

FIG. 5 is a plan view showing electrode patterns and through-holes formed on major surfaces of the ceramic green sheets shown in FIG. 4;

FIG. 6 is a sectional view taken along line VI—VI in FIG. 5;

DESCRIPTION OF THE PREFERRED EMBODIMENTS

Figure 1:
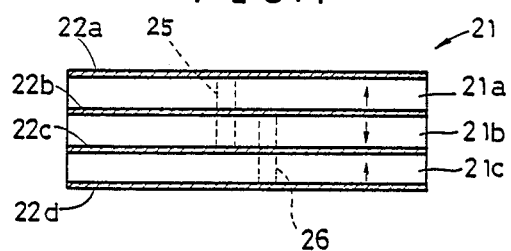
FIG. 1 is a schematic front elevational view showing a multilayer monolithic piezoelectric element according to an embodiment of the present invention.

FIG. 1 is a front elevational view schematically illustrating an embodiment of the present invention. A monolithic piezoelectric element 21 is formed of ceramic layers 21a, 21b, and 21c stacked with intermediate electrodes 22b and 22c therebetween and held between outer electrodes 22a and 22d. The electrodes 22a and 22c of the monolithic multi-layer piezoelectric element 21 are electrically connected with each other by a through-hole 25 which is provided on its inner periphery with a first conductive layer (not shown in FIG. 1) while the electrodes 22b and 22d are electrically connected with each other by a through-hole 26 similarly provided with a second conductive layer on its inner periphery. Thus, the electrodes 22a and 22c form a first electrode group and the electrodes 22b and 22d form a second electrode group. The respective through-holes 25 and 26 are formed at the vibration nodes of the monolithic piezoelectric element 21 or in the vicinity thereof, as hereinafter described. No outer electrodes are provided on the end surfaces of the monolithic piezoelectric element 21 to connect the electrodes 22a to 22d. Thus, it will be understood that the resonance frequency can be controlled by lapping the end surfaces. The through-holes 25 and 26 alternatively be filled up with conductive material to interconnect the electrodes 22a to 22d.

It is preferable to form the through-holes 25 and 26 at the vibration nodes or in the vicinity thereof, since mechanical support of the element is ordinarily provided in these regions. However, the through-holes may be formed if desired in other regions than the vibration nodes or the vicinity thereof.

Figure 2:
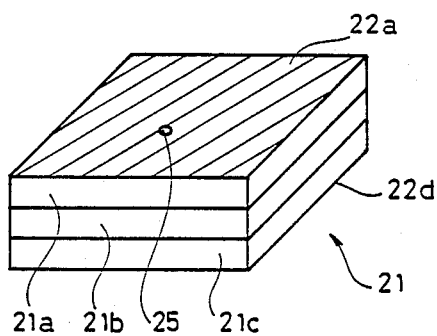
FIG. 2 is a perspective view of the embodiment shown in FIG. 1.

The steps of a method of manufacturing a frequency controlled piezoelectric element as shown in FIGS. 1 and 2 will now be described with reference to in FIG. 3. In order to manufacture a monolithic piezoelectric element as shown in FIGS. 1 and 2, ceramic green sheets 21a, 21b, and 21c, as shown in FIG. 4 in plan view are first prepared. The respective ceramic green sheets 21a to 21c are eventually employed as the ceramic layers 21a to 21c as shown in FIG. 1, and hence they are indicated by the same reference numerals.

Then passholes 25a, 25b, 26b and 26c having the same size are formed in the ceramic green sheets 21a to 21c as shown in FIG. 4, to define the aforementioned through-holes 25 and 26.

Thereafter electrode patterns 22a to 22c are formed by printing or the like on respective front surfaces of the ceramic green sheets 21a to 21c as shown in FIG. 5, and an electrode pattern 22d is formed on the rear surface of the ceramic green sheet 21c, also shown in FIG. 5. That is, FIG. 5 shows green sheet 21c as viewed from both its front side, i.e., the side of the electrode pattern 22c, and from its rear side, the side of electrode pattern 22d, thus clearly illustrating the position of the passhole 26c. As shown in FIG. 5, electrodeless portions 27 and 28 are defined in the centers of the electrode patterns 22b and 22c. Further, the electrode pattern 22b has a projection 29b extending to the passhole 26b provided in its electrodeless portion 27. Thus, the periphery of the passhole 26b is electrically connected with the electrode pattern 22b by the projection 29b. Similarly, the electrode pattern 22c has a projection 29c, although no passhole is defined adjacent the same. However, the projection 29c is formed so as to be located near the passhole 25b formed in the upper ceramic layer 21b upon lamination of the ceramic green sheets 21a to 21c.

Subsequent to the formation of the respective electrode patterns 22a to 22d, conductive layers are formed on the inner peripheries of the passholes 25a, 25b, 26b and 26c. This operation will now be described with reference to FIG. 6, which shows a sectional view taken along line VI—VI in FIG. 5.

As clearly shown in FIG. 6, a conductive layer 31 is formed on the inner peripheral portion of the passhole 25a of the ceramic green sheet 21a, which is provided with the electrode pattern 22a on its upper surface (its front surface in FIG. 5). The conductive layer 31 can be formed by, e.g., printing conductive material extending into both ends of the passhole 25a, i.e., from both surfaces of the ceramic green sheet 21a. In a similar manner, the passholes 25b, 26b and 26c are provided with conductive layers.

Then the ceramic green sheets 21a to 21c provided with the electrode patterns 22a to 22d are as shown in FIGS. 1 and 2 and pressed against each other. In such a state, the passholes 25a and 25b are aligned with each other to form through-hole 25, and the passholes 26b and 26c are aligned with each other to form through-hole 26. Thus, the electrode patterns 22a and 22c are electrically connected with each other through the conductive layers formed in the inner peripheries of the passholes 25a and 25b. The through-hole 25 defined by the passholes 25a and 25b, and the conductive layer formed in the inner periphery thereof provides a first connecting portion of the present invention. The through-hole 26 defined by the passholes 26b and 26c and the second conductive layer formed in the inner periphery thereof provides a second connecting portion to electrically connect the electrode patterns 22b and 22d with each other.

Figure 7A:
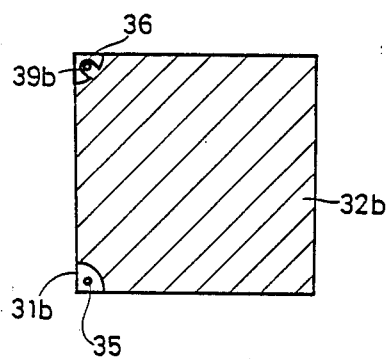
FIG. 7A is a plan view showing an alternative electrode pattern.
Figure 7:
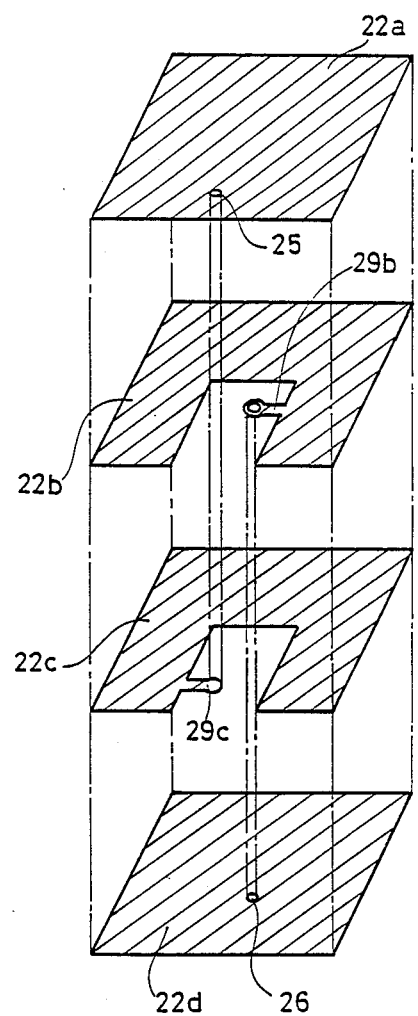
FIG. 7 is an exploded perspective view, partially cutaway illustrating the interrelationship of the stacked electrodes of the piezoelectric element.

FIG. 7 is an exploded perspective view illustrating the stacked relationship of the electrodes 22a to 22d of the monolithic piezoelectric element 21 as shown in FIGS. 1 and 2, in which the front portions of the electrodes 22a to 22d, i.e., the portions toward the viewer as seen in FIG. 7, have been cut away for clarity. As seen in FIG. 7, the electrode 22a is electrically connected with the projection 29c of the electrode 22c through the through-hole 25 while the projection 29b of the electrode 22b is connected with the electrode 22d through the through-hole 26. In an alternate embodiment, as shown in FIG. 7A, through-holes 35 and 36 may be provided in the vicinity of a corners of the ceramic green sheet designated 31b. In such a case, a projection 39b is provided which extends from an electrode 32b formed on the sheet 31b for connection with the through-hole 36. Also, a portion of the electrode 32b surrounding the through-hole 35 is removed. It will be understood that other electrodes are also to be formed in a manner analogous to the arrangement shown in FIGS. 1–7.

Thereafter the monolithic structure is fired under sintering conditions determined according to well-known principles to provide a monolithic piezoelectric element substantially identical in structure to that shown in FIGS. 1 and 2.

Then, continuing with the sequence of steps designated (a) in FIG. 3, the sintered body is polarized by application of a voltage to the electrodes 22a and 22d located on the upper and lower surfaces of the monolithic piezoelectric element 21 as shown in FIGS. 1 and 2. In this operation the ceramic layers 21a to 21c are polarized in the directions indicated by the arrows in FIG. 1.

Thereafter the end surfaces are polished to adjust the resonant frequency of the element. The aforementioned respective steps are applicable not only to manufacture of one monolithic piezoelectric element but to simultaneous manufacture of a number of monolithic piezoelectric elements. In the latter case, the sintered body is then severed to form a plurality of single monolithic piezoelectric elements, prior to polishing.

Then repeated measurements are performed to attain a desired center frequency, the end surfaces of the monolithic piezoelectric element thus obtained being polished again after each measurement if the desired frequency has not been obtained.

According to the embodiment as hereinabove described, the electrodes 22a to 22d are electrically connected with each other by the conductors in the through-holes 25 and 26. Hence, no electrodes are needed to make this connection on the end surfaces, which the can be lapped to control the center frequency.

Figure 8:
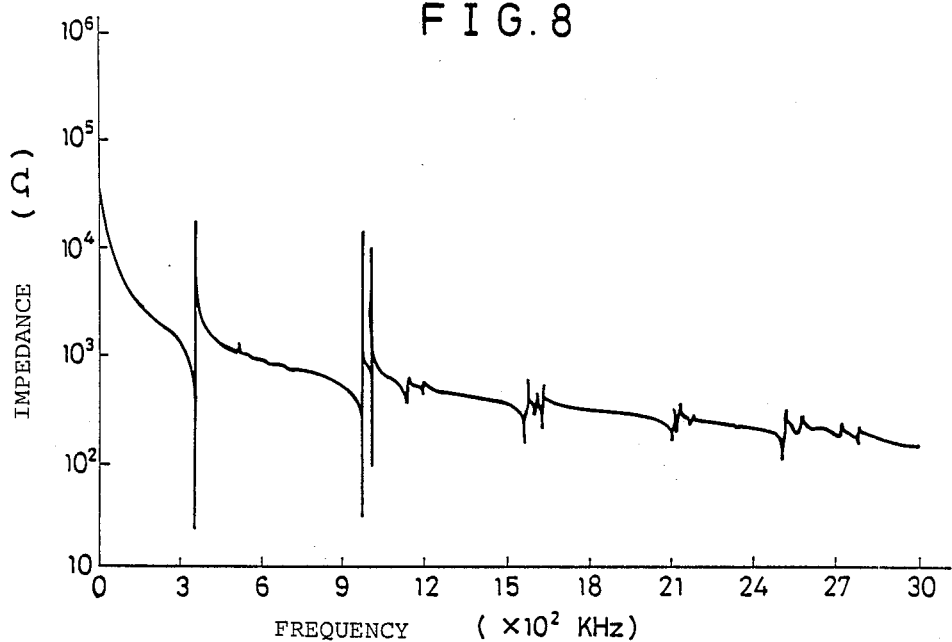
FIG. 8 is a graph illustrating the impedance-frequency characteristics of a conventional plate type piezoelectric element.
Figure 9:
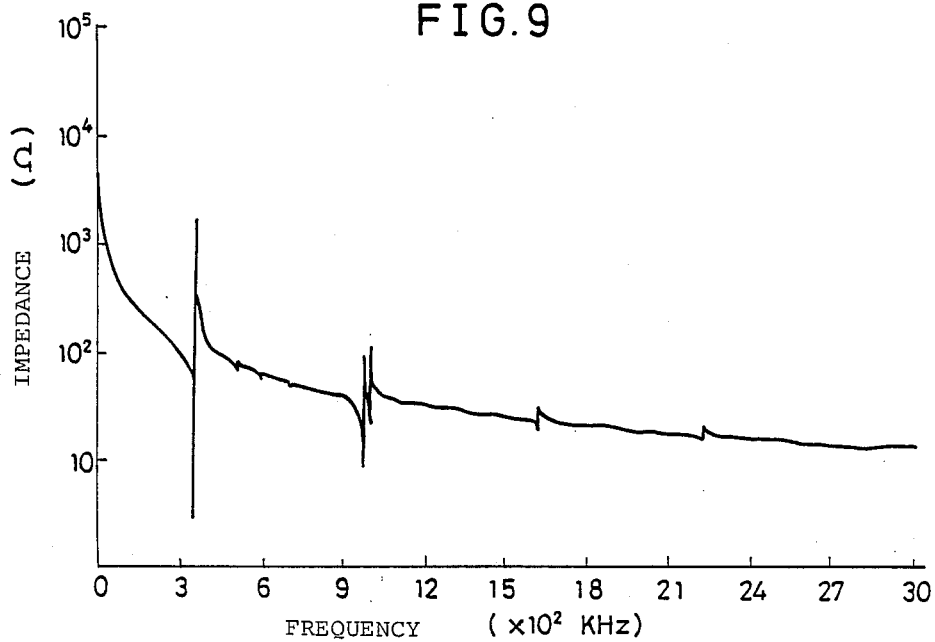
FIG. 9 is a graph illustrating the impedance-frequency characteristics of the embodiment shown in FIGS. 1 and 2.
Figure 10:
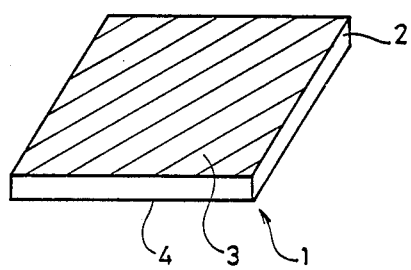
FIGS. 10 and 11 are respectively perspective and sectional views showing an example of a conventional plate type piezoelectric element.
Figure 11:
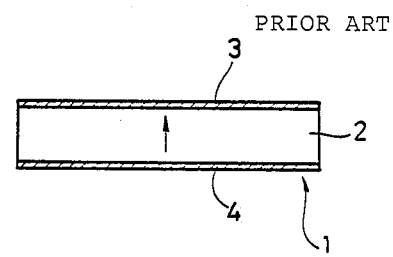
Figure 12:
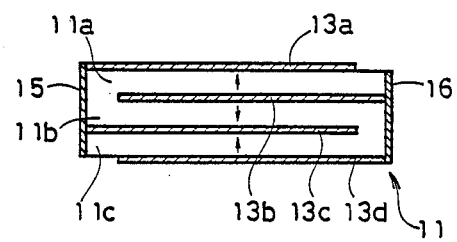
FIG. 12 is a sectional view showing an example of a conventional monolithic multi-layer piezoelectric element.

FIG. 9 shows the impedance-frequency characteristics of the embodiment shown in FIGS. 1 and 2 and manufactured in the aforementioned manner. FIG. 8 the impedance-frequency characteristics of a conventional plate type piezoelectric element 1 as shown in FIG. 10, for comparison. Test examples of the monolithic multi-layer piezoelectric element as shown in FIG. 1 and the plate type piezoelectric element as shown in FIG. 10 were both 7×7 mm in size and 0.5 mm in thickness. It is seen in FIGS. 8 and 9 that, with the embodiment shown in FIG. 1, the impedance can be reduced to a remarkable degree. Spurious vibration based on overtone vibration can also be reduced. Further, sprious vibration based on thickness expansion mode vibration can also be reduced in comparison with the conventional plate type piezoelectric element 1.

Although the embodiment shown in FIGS. 1 and 2 is formed of three ceramic layers and four electrode layers, a monolithic piezoelectric element according to the present invention could be formed of a different number of ceramic layers and electrodes. It could also be formed in a different shape, e.g., a circle, in which the layers utilize counter extensional vibration. Further, the monolithic piezoelectric element may have an even number of ceramic layers, e.g., four or six layers.

Although the electrodes 22a and 22d have been disclosed to have been previously coated on the ceramic green sheets 21a and 21c prior to firing, the same may be formed on the upper and lower surfaces of the sintered body after firing. Such processing is performed in the sequence of steps designated (b) in FIG. 3. This sequence of steps is an effective alternative to the sequence of steps designated (a) in FIG. 3.

Although embodiment of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A method of making a monolithic piezoelectric resonance element having desired resonant frequency characteristics, said method comprising the steps of:
   (a) preparing a monolithic piezoelectric resonance element comprising:
      (1) a sintered piezoelectric ceramic body,
      (2) a pair of electrode groups stacked within said sintered body, said pair of electrode groups comprising a first electrode group which includes a plurality of electrodes arranged to be electrically connected with each other, and a second electrode group which includes electrodes interposed between said electrodes of said first electrode group and arranged to be electrically connected with each other; and
      (3) first and second connecting portions for electrically connecting said electrodes included in said first and second electrode groups respectively, said first and second connecting portions being defined by first and second conductive portions formed within through-holes provided in said sintered body,
   (b) polishing a surface of the monolithic piezoelectric resonance element to adjust its resonant frequency characteristics,
   (c) measuring the resonant frequency characteristics of said monolithic piezoelectric resonance element, and
   (d) repeating said polishing step and measuring step until said desired resonance frequency characteristics are attained.

2. A method as in claim 1, wherein said element has a plurality of substantially rectangular surfaces, and at least one of said surfaces is polished in said polishing step.

3. A method as in claim 2, wherein said element has substantially the shape of a rectangular prism having a top surface, a bottom surface, and four end surfaces, at least one of said end surfaces being polished in said polishing step.

4. A method as in claim 3, wherein all of said four end surfaces are polished in said polishing step.

* * * * *